United States Patent
Yasuyoshi et al.

(10) Patent No.: US 9,437,571 B2
(45) Date of Patent: Sep. 6, 2016

(54) BONDING DEVICE

(71) Applicant: SHIBUYA KOGYO CO., LTD., Kanazawa-shi, Ishikawa (JP)

(72) Inventors: Hiroyuki Yasuyoshi, Kanazawa (JP); Eiji Tanaka, Kanazawa (JP)

(73) Assignee: Shibuya Kogyo Co., Ltd., Kanazawa-shi, Ishikawa (JP)

( * ) Notice: Subject to any disclaimer, the term of this patent is extended or adjusted under 35 U.S.C. 154(b) by 41 days.

(21) Appl. No.: 14/547,912

(22) Filed: Nov. 19, 2014

(65) Prior Publication Data
US 2015/0171048 A1 Jun. 18, 2015

(30) Foreign Application Priority Data
Dec. 12, 2013 (JP) ................. 2013-257282

(51) Int. Cl.
*H01L 23/00* (2006.01)
*B29C 65/16* (2006.01)
(Continued)

(52) U.S. Cl.
CPC ............... *H01L 24/75* (2013.01); *B23K 3/02* (2013.01); *B23K 26/06* (2013.01); *B29C 65/1664* (2013.01); *H01L 24/81* (2013.01); *B23K 2201/36* (2013.01); *H01L 24/16* (2013.01); *H01L 2224/16225* (2013.01);
(Continued)

(58) Field of Classification Search
CPC .......... H01L 2224/75263; H01L 2224/78745; H01L 2224/81224; H01L 24/16; H01L 24/75; H01L 24/81; H01L 2924/4035; B23K 26/06; B29C 65/1648; B29C 65/1651; B29C 65/1664; B29C 65/1677; B29C 65/1687

USPC ........................................... 156/583.4, 272.8
See application file for complete search history.

(56) References Cited

U.S. PATENT DOCUMENTS 5,942,066 A * 8/1999 Sunaga ............... B32B 37/1207
156/102
6,188,044 B1 * 2/2001 Lee ....................... C23C 16/481
118/50.1
6,284,088 B1 * 9/2001 Sampica .............. B25B 11/005
156/285

FOREIGN PATENT DOCUMENTS

JP 2009182162 A * 8/2009
JP 2010-129890 A 6/2010

OTHER PUBLICATIONS

Machine translation of JP2009-182162.*
(Continued)

*Primary Examiner* — Philip Tucker
*Assistant Examiner* — Jimmy Smith, Jr.
(74) *Attorney, Agent, or Firm* — Muncy, Geissler, Olds & Lowe, P.C.

(57) ABSTRACT

A bonding device includes: a plurality of laser oscillators that oscillate laser beams; a plurality of guide beam parts that guide the laser beams oscillated from the laser oscillators; a bonding tool that is irradiated and heated by the laser beams guided from the guide beam parts so that an electronic part held on the bonding tool is heated by the laser beams and is bonded to a base plate. The bonding tool is segmented into a plurality of heat regions, each of the heat regions is irradiated by the laser beams that are guided through the guide beam parts so that some of the heat regions are heated at a temperature different from other heat regions, and an insulation part is disposed at a middle section between two of the heat regions, the insulation part suppressing a heat transfer between the heat regions.

4 Claims, 11 Drawing Sheets

(51) Int. Cl.
*B23K 3/02* (2006.01)
*B23K 26/06* (2014.01)

(52) U.S. Cl.
CPC ............... *H01L 2224/75263* (2013.01); *H01L 2224/78745* (2013.01); *H01L 2224/81224* (2013.01); *H01L 2924/00014* (2013.01); *H01L 2924/4035* (2013.01)

(56) References Cited

OTHER PUBLICATIONS

Machine translation of JP2010-129890.*

* cited by examiner

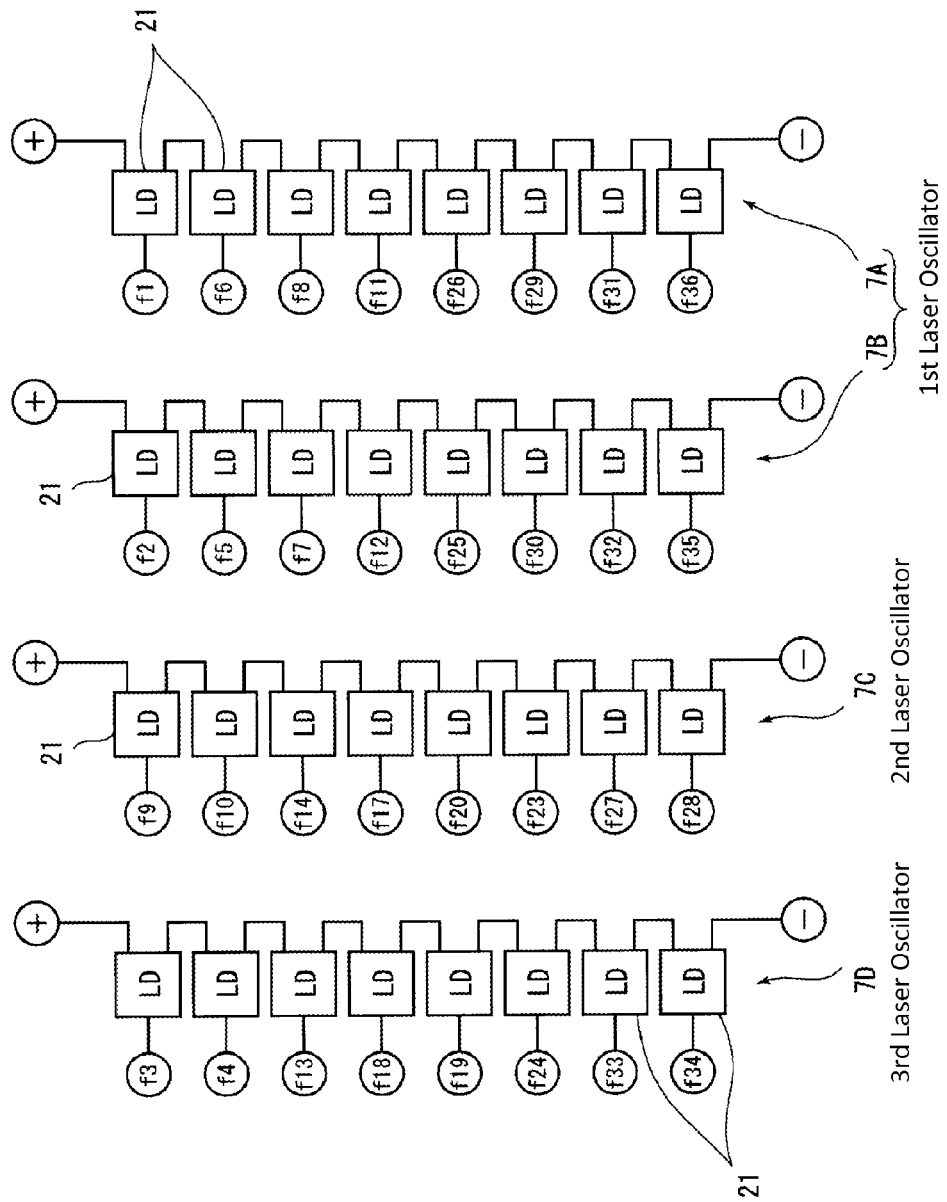

Maximum Level Laser Beam Corner Region

Medium Level Laser Beam Outer Region

Minimum Level Laser Beam Inner Region

No Irradiation Region

Fig. 7B
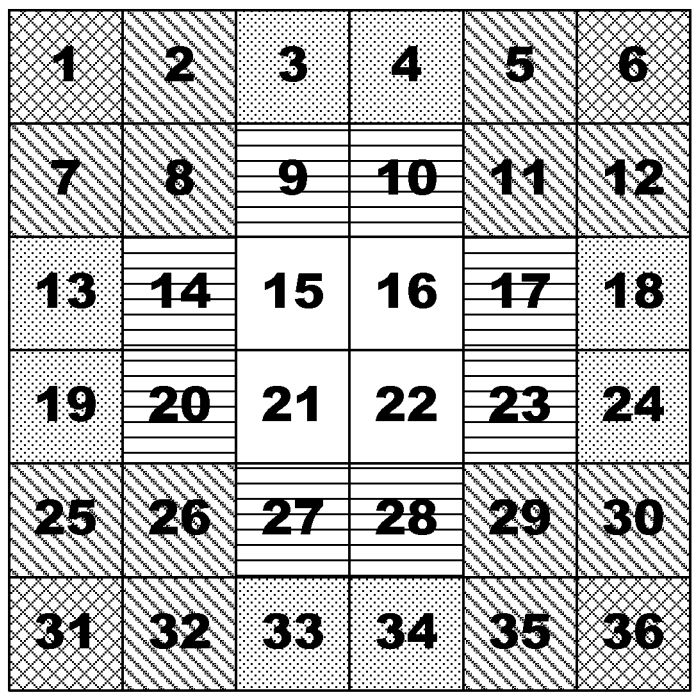
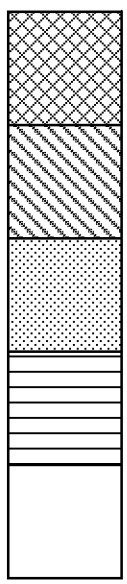
Highest Level Laser Beam
Corner Region
2nd Highest Level Laser Beam
Corner Adjacent Region
3rd Highest Level Laser Beam
Outer Region
4th Highest (or Lowest) Level Laser Beam
Inner Region
No Irradiation Region

BONDING DEVICE

CROSS REFERENCE

The present application is related to, claims priority from and incorporates by reference Japanese Patent Application No. 2013-257282, filed on Dec. 12, 2013.

TECHNICAL FIELD

This invention relates to a bonding device for bonding an electronic part to a base plate, more specifically, a bonding device that is preferred to bond an electronic part to a base plate by heating the electronic part with a laser beam.

BACKGROUND

Conventionally, a device is known that includes a laser oscillator oscillating a laser beam, a guide beam means for guiding the laser beam oscillated from the laser oscillator and a bonding tool irradiated and heated by the laser beam which is guided by the guide beam means. The device heats the electronic part, which is held on the bonding tool, with the bonding tool and bonds them to the base plate (See laid-open patent application publication 2010-0129890).

The bonding device disclosed in the above patent document is designed to uniformly heat the whole region of the bonding tool. The electric part as well is supposed to be entirely heated uniformly.

However, where heat of a circumference region of the electric part easily escapes in comparison with an inner region, the circumference region of the electronic part in practice becomes a low temperature even when entirely heating the electronic part uniformly. Actually, it was difficult to uniformly heat the electronic device at a certain temperature.

The invention considers the drawbacks above, aims to provide a bonding device that is able to heat a whole region of an electronic device under preferred conditions. In order to achieve the aim, the bonding device of the invention is to segment a heat region of a bonding tool into multiples and to heat each of the regions at a different temperature.

SUMMARY

A bonding device disclosed in the application includes: a plurality of laser oscillators that oscillate laser beams; a plurality of guide beam parts that guide the laser beams oscillated from the laser oscillators; a bonding tool that is irradiated and heated by the laser beams guided from the guide beam parts so that an electronic part held on the bonding tool is heated by the laser beams and is bonded to a base plate. The bonding tool is segmented into a plurality of heat regions, each of the heat regions is irradiated by the laser beams that are guided through the guide beam parts so that some of the heat regions are heated at a temperature different from other heat regions, and an insulation part is disposed at a middle section between two of the heat regions, the insulation part suppressing a heat transfer between the heat regions.

With the above structure, advantages below are realized. For example, when an electronic part is square, it is noted that four corner regions at its corners are spots where heat can escape more than the inner region. Among a plurality of the laser oscillators, laser beams oscillated from the first laser oscillator are irradiated to a heat region that corresponds to the four corners of the bonding tool through the first guide beam part, making the heat region at the four corners heated at a high temperature. On the other hand, among a plurality of the laser oscillators, laser beams oscillated from the second laser oscillator are irradiated to another heat region that corresponds to the inner portions of the bonding tool through the second guide beam part, making the heat region heated at a low temperature compared with the heat region corresponding to the four corners. With the invention, a plurality of the heat regions of the electronic part are respectively and independently heated, making it possible to heat a whole region of the electronic part to a preferred temperature.

At the same time, in the bonding tool, an insulation part is disposed at a middle section between the heat region corresponding to the four corners and the heat region corresponding to the inner portions, the insulation part suppressing a heat transfer therebetween. Comparing to where the insulation part does not exist, it is possible to more effectively heat the whole region of the electronic part to a preferred temperature.

BRIEF DESCRIPTION OF THE DRAWINGS

FIG. 2 is an explanatory view for illustrating more specific structure of laser oscillators 7 in FIG. 1.

FIG. 7B illustrates the regions with different hatchings. It is noted that corner adjacent regions are newly added.

DETAILED DESCRIPTION OF THE PREFERRED EMBODIMENTS

Figure 1:
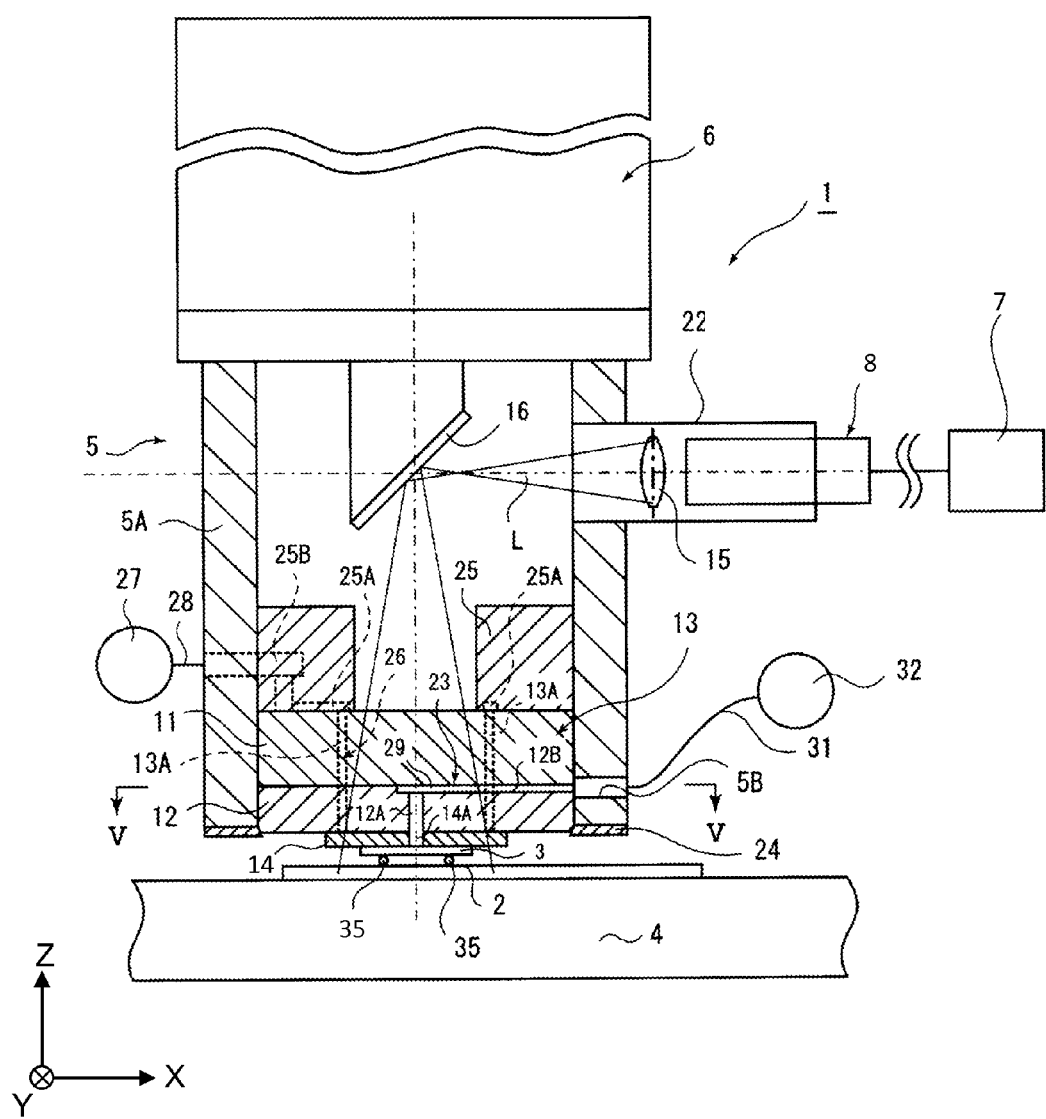
FIG. 1 is a sectional view of first embodiment.
Figure 3A:
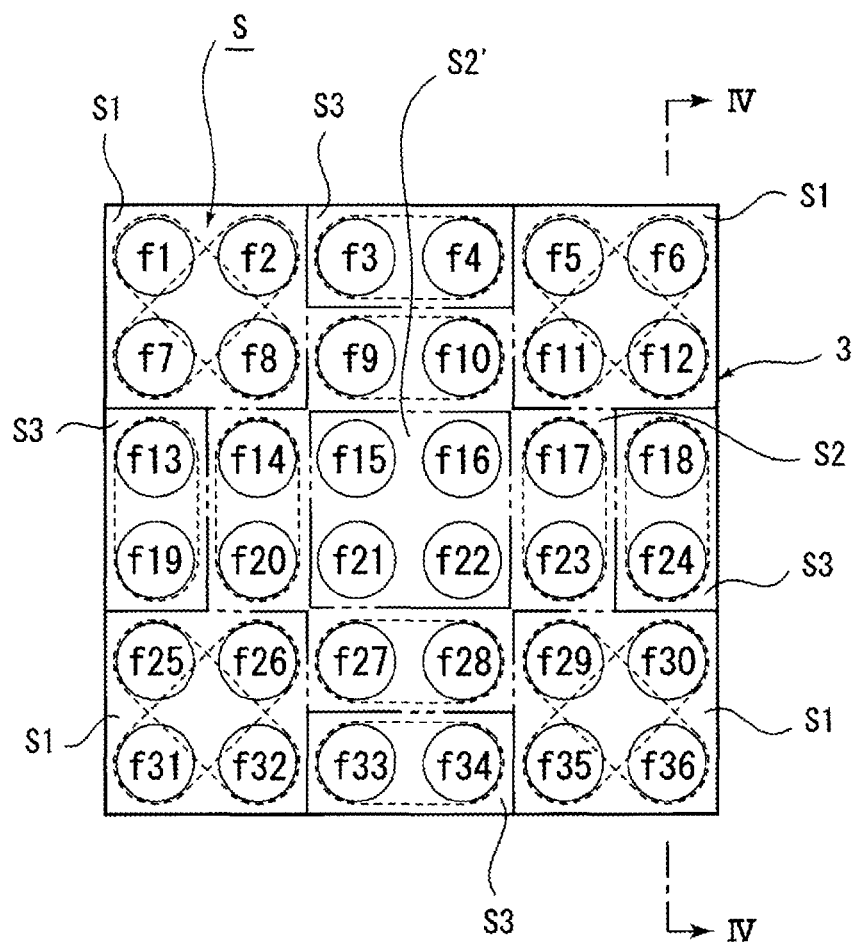
FIG. 3A is an explanatory view for illustrating an arrangement relationship between each of regions S1 to S3 of an electronic part 3 and optical fibers f1 to f36.
Figure 3B:
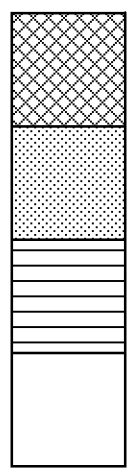
FIG. 3B illustrates the regions with different hatchings in correspondence with levels of laser beams. Each of the regions includes numerals that correspond to the lasers.

The embodiments of the invention are described below. In FIG. 1, a bonding device 1 is configured to bond an electronic part 3 such as a semiconductor chip to a base plate 2. As shown in FIG. 3, the electronic part 3 is formed square in this embodiment. Accordingly, a heat region S, which is designed for heating the whole electronic part 3, is formed square in correspondence with the square shape of the electronic part 3. Four corners of the heat region S are respectively corner regions S1. In the application, the heat region S basically means a region that is heated by an irradiation of either a laser beam or laser beams. The heat region S may mean a segment of the whole heated region according to the context. Corner regions S1, inner regions S2, outer regions S3 and corner adjacent regions S4, which are described later, are the heat regions. On the other hand, no irradiation regions ST is not included in the term.

As shown in FIG. 1, the bonding device 1 includes a base plate stage 4 that supports the base plate 2 and moves the base plate 2 horizontally in X-Y direction, a bonding head 5 that is arranged above the base plate stage 4, a loading mechanism 6 that lifts the bonding head 5 up or down, a laser oscillator that oscillates a laser beam L, and guide beam part 8 that guides the laser beam L oscillated from the laser oscillator 7 into the bonding head 5.

The bonding head 5 is provided with a housing 5A that is in a cylindrical shape. At a lower end part of the housing 5A, tool base 13, which is configured with double layered permeation members 11, 12, is horizontally fixed. A lower surface of the tool base is configured to detachably suck and hold the bonding tool 14. At the same time, a lower surface of the tool base is configured to detachably suck and hold the electronic part 3.

To a side upper part of the housing 5A, a laser beam injection opening, which is one end of the laser guide part 8, is connected such that they are aligned horizontally. Another laser beam injection opening, which is the other end of the laser guide part 8, is connected to the laser oscillator 7.

The laser beam L oscillated from the laser oscillator 7 is irradiated horizontally toward an axial core of the housing 5A through the laser guide part 8, also is condensed by a condensing beam lens 15 in a predetermined size. The laser beam L irradiated in the horizontal direction is reflected vertically downwardly by a reflection mirror 16 that is arranged at an upper center part inside the housing 5A, penetrates the tool base 13, reaches the bonding tool 14, and heats the bonding tool 14. Thereby, the electronic part 3, which is held by the bonding tool 14, as well is heated.

Operations of the base plate stage 4, the loading mechanism 6 and the laser oscillator 7 are controlled by a controller (not shown). When the controller causes the laser oscillator 7 to operate, the laser beam L is oscillated from the laser oscillator 7. The laser beam L is guided to the bonding head 5 through the guide beam part 8, thereafter, is irradiated to the bonding tool 14 in order to heat the tool 14.

The laser oscillator 7 of the embodiment is composed with a set of four laser oscillation parts 7A to 7D. Each of the laser oscillation parts 7A to 7D is provided with a set of eight laser oscillation elements 21 that are arranged in series. As a whole, the laser oscillator 7 is provided with the laser oscillation elements 21 that are total thirty two (4×8).

Those eight laser oscillation elements 21 in each of the sets are arrange in series, the sets are respectively connected to power sources (not shown). By the power sources, the eight laser oscillation elements 21 in the every set output the laser beams L with identical output level.

A first laser oscillator is composed with the laser oscillation parts 7A and 7B. Second and third laser oscillators are respectively composed with the laser oscillation parts 7C and 7D.

In the embodiment, because eight laser oscillation elements 21 are connected in series as one group, each of the laser oscillation elements 21 is controlled by the group unit, making it easier to control them. Because it is also possible to reduce the number of the power sources, it reduces an initial cost of the bonding device 1 as well as power consumption. Thereby, the running cost as well is reduced.

Next, in the embodiment, the heat region S is segmented with following three regions S1 to S3. Corner regions S1 are positioned at four corners as discussed above. Inner regions S2 are positioned at inner side of the electronic part 3. Outer regions S3 are positioned in a periphery of the electronic part 3, the regions S3 being other than the corner regions S1 or inner regions S2. The first, second and third laser oscillators respectively correspond to the regions S1 to S3.

Among the first to third laser oscillators, the laser oscillations parts 7A and 7B of the first laser oscillator are set to have the maximum level output, directly heating the bonding tool 14 with the maximum output. Four of the corner regions S1 of the electronic part 3 are heated with the maximum output.

On the other hand, the second laser oscillator is set to have the minimum level output, and heats the inner regions S2 that are at the inner side of the electronic part 3. The third laser oscillator is set to have a medium level output, and heats the outer regions S3.

As discussed above, by individually setting their outputs of the first to third laser oscillators, the heat region S of the electronic part 3 is heated as evenly as possible. For example, the laser oscillation elements 21 composing the laser oscillation parts 7A and 7B have 100% level output, the laser oscillation elements 21 composing the laser oscillation part 7D have 60% to 70% level output, and the laser oscillation elements 21 composing the laser oscillation part 7C have 20% to 40% level output.

The guide beam part 8 is, as shown in FIG. 3, composed with a bundle of thirty six optical fibers f1 to f36 having an identical outer diameter. Each of the optical fibers f1 to f36 has an original guide beam path. Each of the laser beams running through the optical fibers is guided to the bonding head 5, is irradiated on the heat region S of the electronic part 3 in a spot manner, resulting in heating the whole heat region S.

Laser beam injection openings of the thirty six optical fibers f1 to f36 are fixed to the inside of a cylindrical casing 22 that is horizontally attached to a side surface upper part of the housing 5A in a bundled state. These openings are connected to the side surface of the housing 5A in the horizontal state through the casing 22, and respectively face the regions S1 to S3 of the electronic part 3, through condensing beam lens 15, reflection mirror, further the bonding tool 14.

More specifically, the laser beam injection openings of the thirty six optical fibers f1 to f36 are arranged in a matrix state that is 6 lateral×6 vertical formats. The openings f1 to f36 are arranged in an order from the upper left to the lower right. The thirty six optical fibers f1 to f36 are divided into three groups that correspond to the three regions S1 to S3.

Namely, as shown in FIG. 3, the laser beam injection openings of the four optical fibers are arranged to optically face each of the corner regions S1. Four optical fibers f1, f2, f7 and f8 are arranged for the corner region S1 that is at the upper left, four optical fibers f5, f6, f11 and f12 are arranged for the corner regions S1 that is at the upper right. Four optical fibers f25, f26, f31 and f32 are arranged for the corner regions S1 that is at the lower left. Four optical fibers f29, f30, f35 and f36 are arranged for the corner regions S1 that is at the lower right.

Those sixteen optical fibers compose the first group of the optical fibers. Among those sixteen optical fibers composing the first group, four optical fibers f1, f6, f31 and f36 that are each arranged at the most outer sides in the corner regions S1 and four optical fibers f8, f11, f26 and f29 that are each positioned at diagonal lines in the corner regions S1 and at the most inner sides are grouped. As shown FIG. 2, the laser beam injection openings are each connected to the laser oscillation elements 21 of the laser oscillation part 7A.

The remaining eight optical fibers f2, f5, f7, f12, f25, f30, f32 and f35 are grouped. The laser beam injection openings of those are each connected to the laser oscillation elements 21 of the laser oscillation part 7B.

Accordingly, laser beams from the laser oscillation parts 7A and 7B that are set to have the maximum level output are respectively irradiated on the corner regions S1 through the first group of the sixteen optical fibers.

In addition, the output of the laser oscillation part 7A may be higher than that of the laser oscillation part 7B, the laser oscillation part 7A including the laser oscillation elements 21 connected to the optical fibers f1, f6, f31 and f36 corresponding to the four corners.

Among the remaining sixteen optical fibers, twelve optical fibers f9, f10, f14-f17, f20-f23, f27 and f28 compose the second group. Laser beam injection openings of the optical fibers in the second group optically face the inner regions S2.

In the embodiment, a no irradiation region S2' where no laser beam is irradiated is present at a center position of the electronic part 3. Among the optical fibers in the second group, laser beam injection openings of the four optical fibers f15, f16, f21 and f22 that are positioned at the center face the no irradiation region S2'. Because the four optical fibers do not have to irradiate laser beams, those optical fibers are not connected to the laser oscillation part 7C that is the second laser oscillator.

Opposing to the structure, each of the laser beam injection openings of the remaining eight optical fibers f9, f10, f14, f17, f20, f23, f27 and f28 is connected to the laser oscillation part 7C that has the minimum level output and is the second laser oscillator (see FIG. 3). Accordingly, laser beams from the laser oscillation part 7C are guided to the inner regions S2 except for the no irradiation region S2' through the above discussed total eight optical fibers that are the second group, the laser beams heating these regions.

Additionally, the optical fibers f15, f16, f21 and f22 that face the no irradiation region S2' may be omitted.

The last eight optical fibers f3, f4, f13, f18, f19, f24, f33 and f34 compose the third group. Laser beam injection openings of the optical fibers in the third group optically face the outer regions S3 (see FIG. 3). Each of the laser beam injection openings is connected to the laser oscillation part 7D that has the medium level output (see FIG. 2).

Accordingly, laser beams from the laser oscillation part 7D are guided to the outer regions S3 through the total eight optical fibers that are the third group, the laser beams heating these regions.

Figure 4:
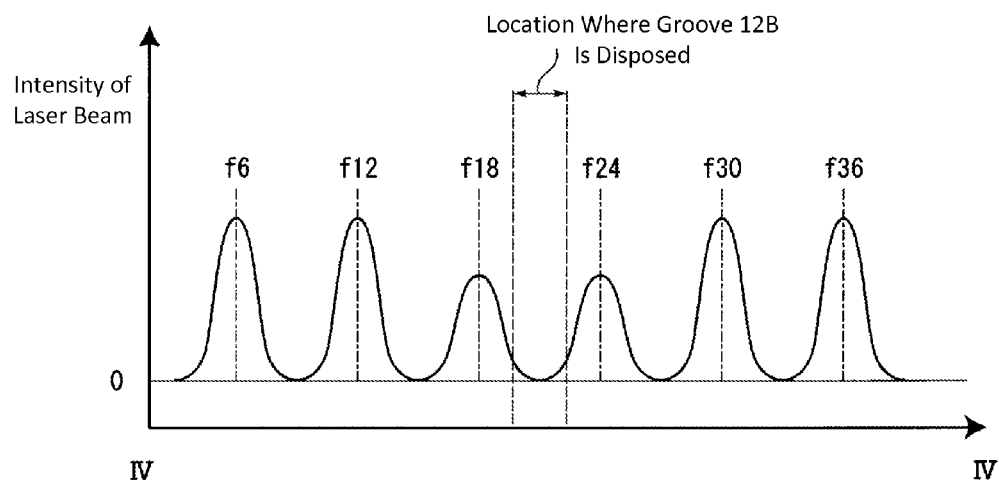
FIG. 4 is an explanatory view for illustrating a strength distribution (or beam profile) of laser beams L at a cross section along IV-IV line in FIG. 3.

By the way, in the embodiment, an intensity distribution (or beam profile) of each laser beam L is in a Gaussian mode (see f6, f12, f18, f24, f30 and f35 in FIG. 4). In Gaussian mode, the laser beam L at the irradiation spot has the largest intensity at a beam axis. The periphery of the beam axis has smaller intensity than at the beam axis. Namely, when two of the laser beams that are adjacent irradiate, an area therebetween is a weak intensity. Using the feature, a groove 12B that composes a chip suck path 23 for the electronic part 3 is disposed at a middle section of the two adjacent lines of the laser beams L, which is discussed later.

Next, the tool base 13 and its peripheral structure are explained based on FIG. 1. The tool base 13 of the embodiment is in a lamination structure in which a permeable member 11 made of sapphire is an upper layer and a permeable member 12 made of quartz glass is a lower layer.

The both permeable members 11 and 12 in the lamination status are fit in an inter peripheral part that is a lower part of the housing 5A. A lower surface of the permeable member 12 is horizontally held at the substantially same height as a lower end surface of the housing 5A by a ring shaped attachment member 24. On the other hand, an upper surface of the permeable member 11 in the lamination state is pressed and horizontally held by a ring shaped stopper 25 that is fit in the housing 5A. Therewith, the both permeable members 11 and 12 composing the tool base 13 is horizontally supported at a lower part in the housing 5A. Also, the lower surface of the permeable member 11 and the upper surface of the permeable member 12 are contacted maintaining an airtight condition.

In the embodiment, a tool suck path 26 is formed over the housing 5A, stopper 25 and tool base 13. The above discussed chip suck path 23 is formed over the housing 5A, the both permeable members 11 and 12, and the bonding tool 14. When a negative pressure (air pressure) is supplied to the tool suck path 26 from a negative pressure source 27 through a guide tube 31, the bonding tool 14 is sucked and held to a lower surface (or the lower surface of the permeable member 12) of the tool base 13. Also, when a negative pressure is supplied to the chip suck path 23 through the guide tube 31 from a negative pressure source 32, the electronic part 3 is sucked and held to the lower surface of the bonding tool 14 that is in a held status by the tool base 13. The negative pressure means an air pressure that is lower than the atmosphere.

Figure 5:
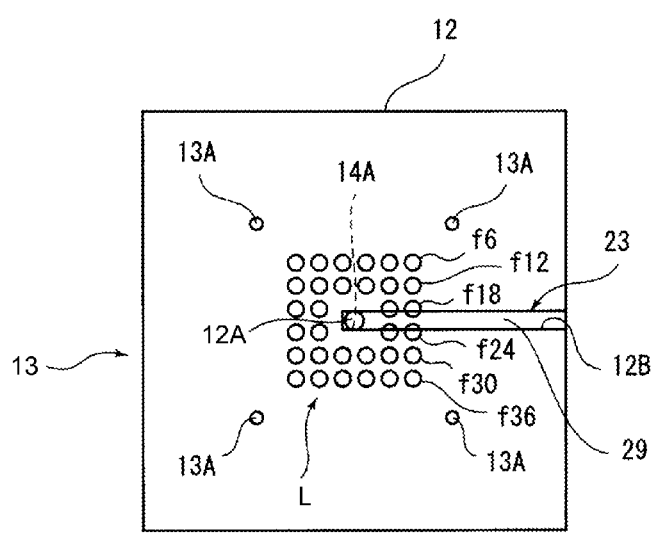
FIG. 5 is a sectional view along V-V line in FIG. 1.

As shown in FIG. 1 and FIG. 5, corresponding to four corners of the bonding tool 14 that are in the square shape, four penetration holes 13A are formed over the permeable members 11 and 12 (tool base 13) that are arranged at upper and lower. An upper end of each of the penetration hole 13A is communicatively connected to a groove 25A that is formed at a lower surface of the stopper 25. The groove 25A is connected to one end of the guide tube 28 through a connection hole 25B that is in an L-letter shape formed over the stopper 25 and the housing 5A.

The other end of the above guide tube 28 is connected to the negative pressure source 27. The operation of the negative pressure source 27 is controlled by the controller. When performing a bonding operation by the bonding device 1, the controller controls the negative pressure source 27. Therefore, during the bonding operation, a negative pressure is supplied to the tool suck path 26, and the bonding tool 14 is sucked and held at the lower surface (or lower surface of the permeable member 12) of the tool base 13.

Next, the above discussed chip suck path 23 is explained. At the center of the permeable member 12 that is the lower layer, the penetration hole 12A that runs in the up-down direction is formed. Further, at the upper surface of the permeable member 12 continuing from an upper end of the penetration hole 12A, a groove 12B that is in a linear shape and reaches the inner surface of the housing 5A is formed. In the housing 5A, a penetration hole 5B that runs in the horizontal direction is formed at a position corresponding to an outer end of the groove 12B.

The linear shape groove 12B is formed at the upper surface of the permeable member 12 so that the groove 12B is positioned between two adjacent lines of the irradiation spots of the above discussed optical fibers 21 (see FIG. 5). Since the whole region of the linear shaped groove 12B is covered by the lower surface of the permeable member 11, an inner space of the groove 12B is formed as a horizontal hole that outwardly extends from its center. With inner spaces of the penetration hole 12A that is in the up and down direction and the groove 12B that is in the horizontal direction formed in the permeable member 12, a connection path 29 is formed inside the tool base 12. Namely, the connection path 29 is a section where the irradiation direction of each of the laser beams L irradiated from the optical fibers intersects with the chip suck path 23.

On the other hand, at a center of the bonding tool 14, a penetration hole 14A is formed. When the bonding tool 14 is sucked and held at the lower surface of the tool base 13, the penetration hole 14A of the bonding tool 14 is communicatively connected to the penetration hole 12A of the tool base 13.

One end of the guide tube 31 is connected to the penetration hole 5B of the housing 5A, and the other end of the guide tube 31 is connected to the negative pressure source 32. The operations of the negative pressure source are controlled by the controller. By supplying a negative pressure from the negative pressure source to the chip suck path 23 at a predetermined timing, the controller sucks and holds the electronic part 3 at the lower surface of the bonding tool 14.

Figure 6:
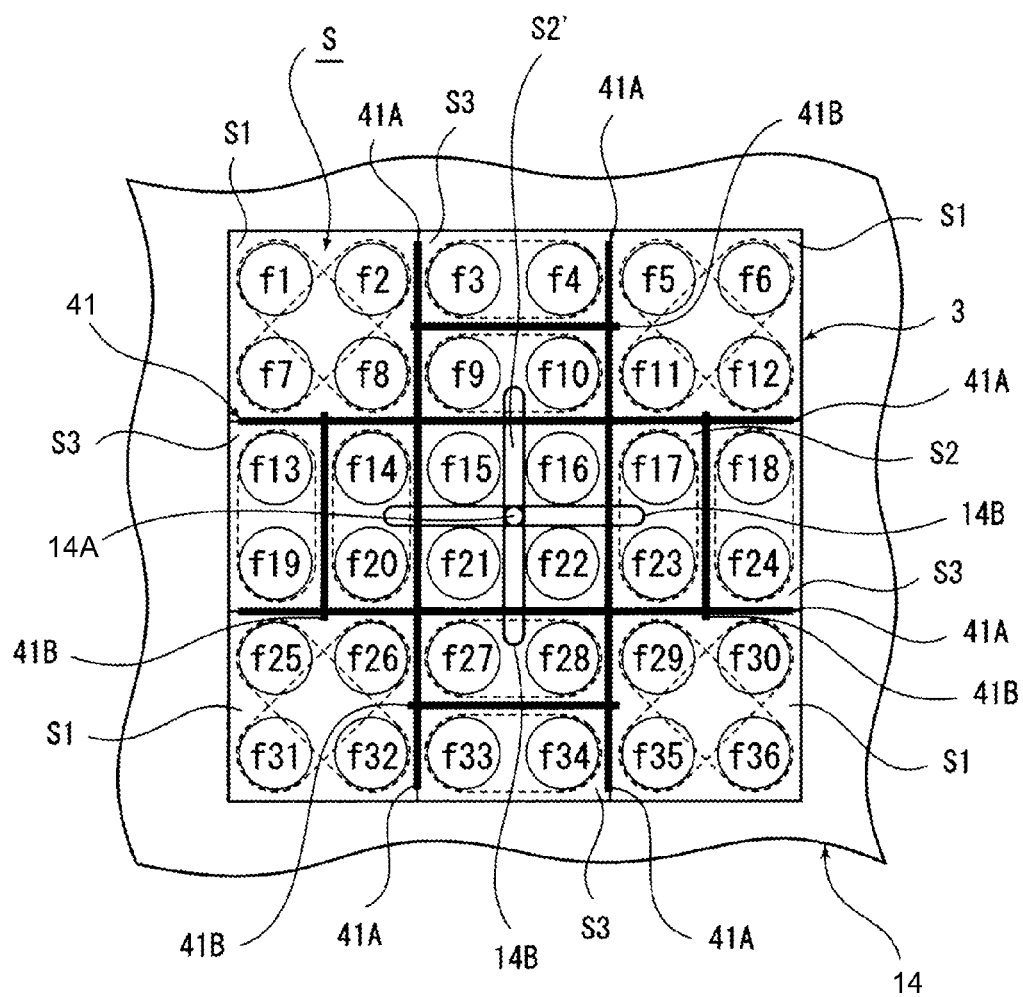
FIG. 6 is a bottom view of a bonding tool 14 of the first embodiment.

In the embodiment, a suck groove 14B is formed that is communicatively connected to the penetration hole 14A, as shown in FIG. 6, at the lower surface of the bonding tool 14 that is namely a suck surface for sucking the electronic part 3. The electronic part 3 is sucked and held at the lower surface of the bonding tool 14 through the suck groove 14B. The whole region of the suck groove 14B is configured to be airtight by the electronic part 3. Therewith, the negative pressure imported to the suck groove 14B rarely escapes to the outside.

In the embodiment, the chip suck path 23 is configured with the suck groove 14B of the bonding tool 14, the up and down direction penetration hole 14A, the connection path 29, the penetration hole 5B of the housing 5A and the guide tube 31.

Further, at the lower surface of the bonding tool 14, an insulation groove 41 is formed, that function as an insulation means suppressing the heat transfer between the above multiple heat regions S1-S3.

In order to insulate the corner regions S1 at the four corners from the other heat regions S2 and S3 (more specifically, inner regions S2 and outer regions S3), total four insulation grooves 41A are formed, that are two pairs of two parallel grooves, one being up to down direction, the other being right to left direction in FIG. 6. Those total four grooves 41A are positioned between the corner regions S1 at the four corners and the other heat regions S2 and S3. With the structure, the insulation grooves 41A insulate middle sections between the inner regions S2 and the no irradiation region S2' that is at its center position.

Also, other insulation grooves 41B, which are total four, are formed at middle sections between the inner regions S2 and the outer regions S3. With the four insulation grooves 41A, the heat transfers between the inner regions S2 and the outer regions S3 are suppressed.

The insulation grooves 41A and 41B are communicatively connected to the suck groove 14B so that the negative pressure is imported to each of the grooves 41A and 41B. By importing the negative pressure inside the insulation grooves 41A and 41B as well, insulation efficiency by the insulation grooves 41A and 41B is improved in comparison to where the negative pressure is not imported. However, in order not to leaking the negative pressure from the insulation grooves 41A and 41B to the outside, the whole region of the insulation groove 41A and 41B is configured to be airtight by the electronic part 3.

Additionally, the depth of the insulation groove 41 (or 41A and 41B) is formed deep in order effectively suppress the heat transfers that are caused at both sides of the insulation groove 41. As long as the negative pressure can be imported, any depth is practical for the suck groove 14B. Thereby, the depth of the suck groove 14B is shallow.

In the above structure, at a beginning of the bonding operation, since the controller supplies a negative pressure from the negative pressure source 27 to the tool suck path 26, the bonding tool 14 is sucked and held at the lower surface of the tool base 13. Since the negative pressure is supplied from the negative pressure source 31 to the chip suck path 23 under the operation by the controller, the electronic part 3 is sucked and held at the lower surface of the bonding tool 14. At this time, as explained above, the suck groove 14B and insulation groove 41 are airtight by the electronic part 3, the negative pressure imported inside the chip suck path 23 does not leak (or escape) outside.

After that, the controller operates the base plate stage 4, making the base plate 2 and the electronic part 3 held by the bonding tool 14 in an alignment status, lifting the bonding head down by the loading mechanism 6 (in other words, descending the head). Therewith, the electronic part 3 sucked and held by the bonding tool 14 contacts and is pressed to the base plate 2. After that timing, the laser beam L is irradiated from each of the laser oscillation elements 21 by the controller operating the laser oscillator 7. Then, the multiple laser beams L are guided to the housing 5A through the guide beam part 8 that is composed with the multiple optical fibers f1 to f36 (except for f15, f16, f21 and f22), are condensed at a condensing beam lens 15. The direction of the laser beams L is changed toward the vertical direction at the reflection mirror 16, and the laser beams L reaches the tool base 13.

As explained above, since the multiple optical fibers f1 to f36 are bundled in the matrix state, irradiation spots of the optical fibers as well are in the matrix state when the laser beams L are irradiated from the optical fibers f1 to f36 to the tool base 13 (see FIG. 3 and FIG. 5).

At this time, as shown in FIG. 5, in order to prevent the laser beams L from scattering by the penetration hole 12A of the tool base 13, the no irradiation region S2' to which the laser beams L are not irradiated is disposed at the periphery of the penetration hole 12A.

The groove 12B to which the negative pressure is supplied and that is in the linear shape is arranged at the middle section between adjacent two lines of the laser beams L. Further, as shown in FIG. 4, the profile of intensity of the laser beam L is Gaussian mode. Thereby, even though the groove 12B is formed in the tool base 13, the loss of the heat of the laser beams L by the groove 12B is minimalized.

When the laser beam L penetrates the tool base 13, which is composed with the two layered permeable members 11 and 12, and is irradiated to the bonding tool 14, the bonding tool 14 is heated by the laser beam L, causing bumps 35 to be heated which are arranged at multiple spots under the electronic part 3 and its lower surface (see FIG. 1).

At the moment, to the four corner regions S1 that have a tendency to be at lower temperature, the laser beams having the maximum level output are guided from the laser oscillation parts 7A and 7B that are the first oscillator. To the inner regions S2 that have a tendency to be at higher temperature, the laser beams having the minimum level output are guided from the laser oscillation part 7C that is the second oscillator. To the outer regions S3 that have a tendency to be at medium temperature, the laser beams having the medium level output are guided from the laser oscillation part 7D that is the third oscillator. Accordingly, the electronic part 3 is as a whole heated as uniformly as possible.

In the bonding tool 14, the insulation grooves 41, which suppress the heat transfer therebetween, are disposed at middle sections between those of the corner regions S1, the inner regions S2, the outer regions S3 and the no irradiation region S2'. Thereby, in comparison to a structure without the insulation grooves 41, it is possible to more effectively heat the whole region of the electronic part to a preferred temperature.

When the bonding operation is completed, the negative pressure supply is stopped from the negative pressure source 32 to the chip suck path 23 by an instruction from the controller. The holding of the electronic part 3 by the bonding tool 14 is released. After that, the loading mechanism 6 lifts the bonding head 5 up, is prepared for the next bonding operation.

Figure 7A:
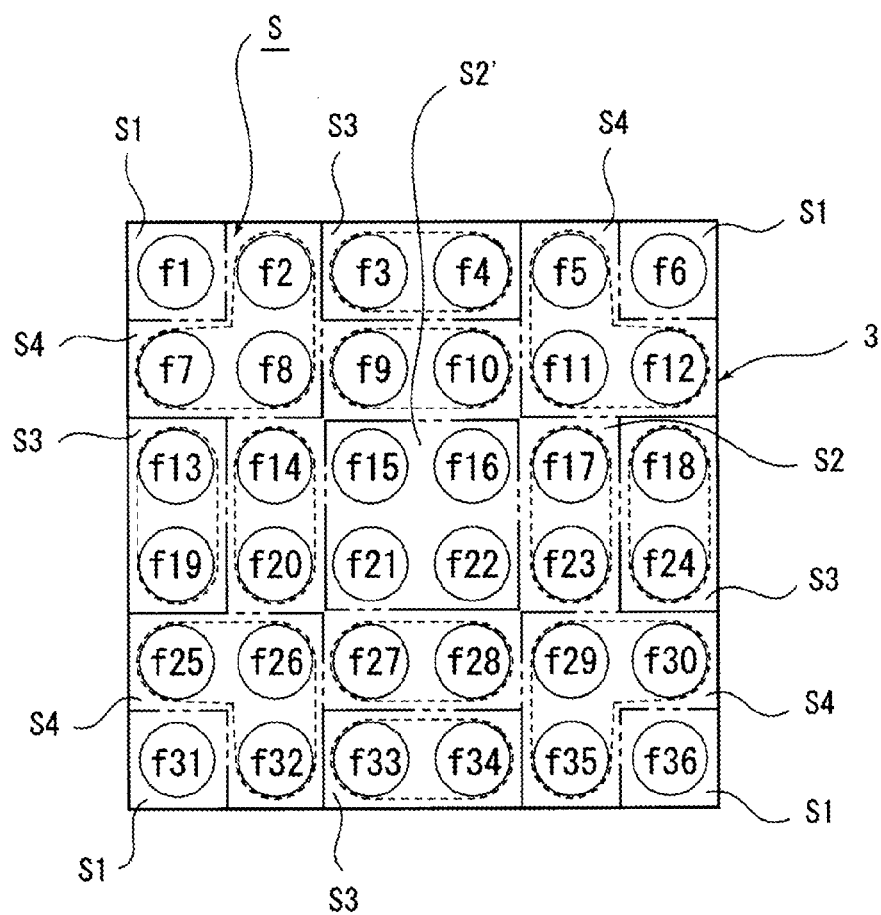
FIG. 7A is an explanatory view for illustrating second embodiment in a similar manner to FIG. 3A. In the same fashion as FIG. 3B.

FIG. 7 illustrates the second embodiment of the invention. In the embodiment, the heat region S is segmented into four type regions.

Specifically, the heat region S is segmented with four corner regions S1 that are discussed above, corner adjacent regions S4 that are new from the first embodiment, outer regions S3 and the inner regions S2 that are discussed above. The corner adjacent regions S4 surround the corner regions S1. The outer regions S3 are defined by extracting the corner regions S1 and the corner adjacent regions S4 from an outer periphery region at the outer periphery side of the electronic part 3.

Figure 8:
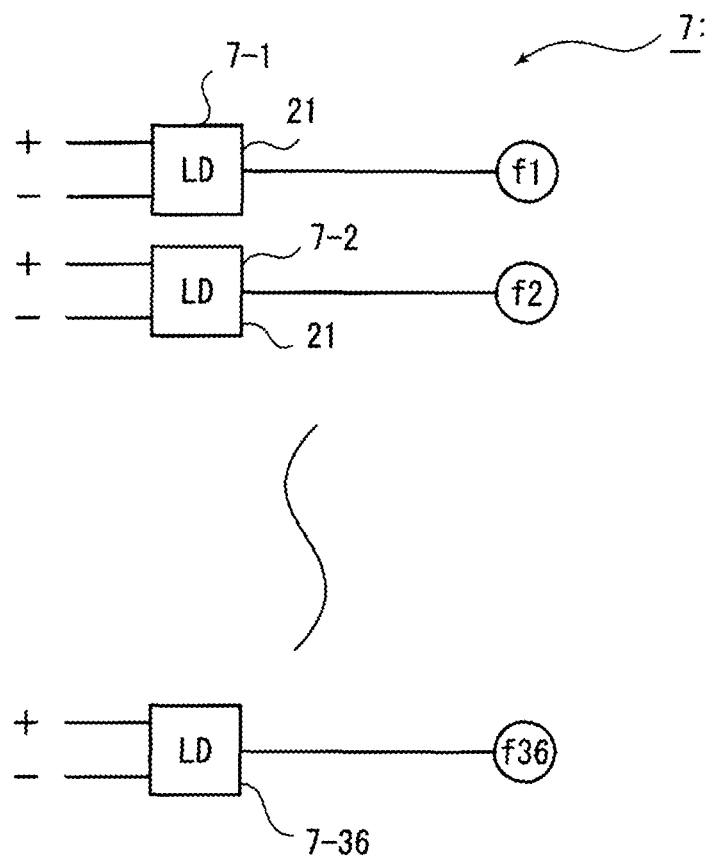
FIG. 8 is an explanatory view for illustrating a respective relationship between optical fibers f1 to f36 and laser oscillators 7-1 to 7-36.

In the embodiment, the thirty six optical fibers f1 to f36 are bundled in parallel. As shown in FIG. 8, laser beam injection openings of the optical fibers f1 to f36 are respectively and independently connected to laser oscillation parts 7-1 to 7-36. Namely, each of the optical fibers is connected to one laser oscillation part, a laser output of each of the laser oscillation parts is controlled.

As shown in FIG. 7, among the corner regions S1 at the four corners, optical fiber f1 is arranged to face a corner region S1 at the upper left, optical fiber f6 for a corner region S1 at the upper right, optical fiber f31 for a corner region S1 at the lower left and optical fiber f36 for a corner region S1 at lower right.

Those four laser oscillation parts 7-1, 7-6, 7-31 and 7-36, which are connected to the optical fibers f1, f6, f31 and f36, are set to have the highest level output.

Among the four corner adjacent regions S4 that each surround the corner regions S1, three optical fibers f2, f7 and f8 face the corner adjacent region S4 at the upper left, three optical fibers f5, f11 and f12 face the corner adjacent region S4 at the upper right, three optical fibers f25, f26 and f32 face the corner adjacent region S4 at the lower left, three optical fibers f29 f30 and f35 face the corner adjacent region S4 at the lower right, Twelve laser oscillation parts 7-2, 7-7, 7-8, 7-5, 7-11, 7-12, 7-25, 7-,26, 7-32, 7-29, 7-30, 7-35 connected to the total twelve optical fibers are set to have the second highest level output.

Total eight optical fibers f3, f4, f13, f18, f19, f24, f33 and f34 respectively face the outer regions S3. Eight laser oscillation parts 7-3, 7-4, 7-13, 7-18, 7-19, 7-24, 7-33 and 7-34 connected to the total eight optical fibers are set to have the third highest level output.

Total twelve optical fibers f9, f10, f14, f15, f16, f17, f20, f22, f23, f27 and f28 respectively face the inner regions S2. Similar to the first embodiment, a no irradiation region S2' is formed at a center of the inner regions S2 in the embodiment as well. Four optical fibers f15, f16, f21 and f22 face the no irradiation region S2'.

Accordingly, four laser oscillation parts 7-15, 7-16, 7-21 and 7-22 that are connected to the four optical fibers f15, f16, f21 and f22 facing the no irradiation region S2' are not to be activated or to oscillate a laser beam. When the bonding device 1 is composed exclusively for the electronic part 3, needless to say, the four laser oscillation parts 7-15, 7-16, 7-21 and 7-22 may be omitted.

On the other hand, eight optical fibers f9, f10, f14, f17, f20, f23, f27 and f28 facing the inner regions S2 that does not include the no irradiation region S2' are connected to eight laser oscillation parts 7-9, 7-10, 7-14, 7-17, 7-20, 7-23, 2-27 and 7-28. Those laser oscillation parts are set to have the fourth height level output, putting it another way, the lowest level output.

Figure 9:
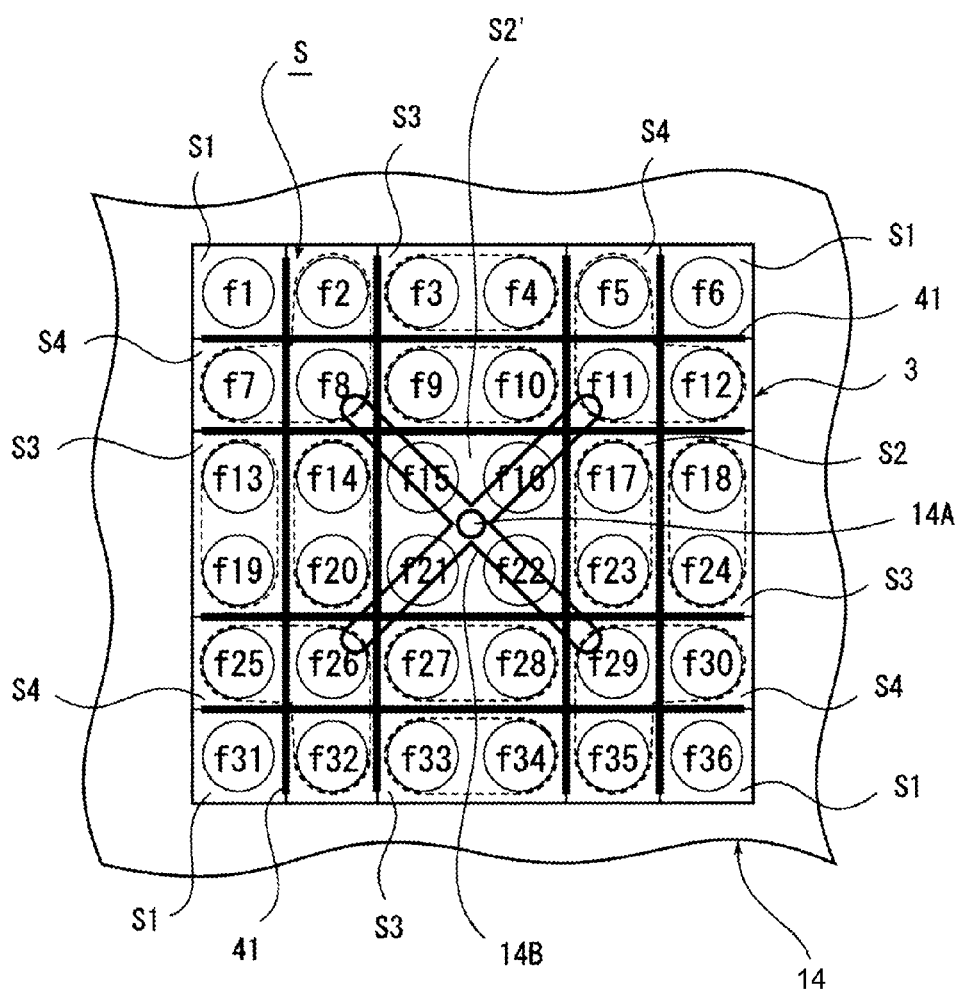
FIG. 9 is a bottom view of a bonding tool 14 of the second embodiment.

As shown in FIG. 9, in order to suppress a heat transfer between those of the total five heat regions S1 to S4 and S2', total eight insulation grooves 41 are provided at a lower surface of the bonding tool 14.

As it is understood from FIG. 9, for example, the corner adjacent region S4 at the upper left is a region that is heated at an identical temperature by the three optical fibers f2, f7 and f8. Sub regions that are respectively heated by the optical fibers f2, f7 and f8 are insulated by the insulation grooves 41. In this manner, even when these sub regions are supposed to be heated at an identical temperature, these sub regions might as well respectively be insulated. Accordingly, as shown with imaginary lines in FIG. 9, insulation grooves 41 may be provided at all middle sections between all thirty six sub regions that are heated by the thirty six optical fibers f1 to f36

The bonding tool 14 in the second embodiment, in which insulation grooves 41 are provided at the all middle sections between the thirty six sub regions, is obviously useful as the bonding tool 14 in the first embodiment. Usability of the bonding tools 14 is enhanced.

Other components are the same as the first embodiment has.

In the second embodiment, laser outputs of the laser oscillators are set to get higher in an order from the laser oscillator that is connected to the optical fibers of which the laser beam injection openings face the inner regions S2 except for the no irradiation region S2', the laser oscillator that is connected to the optical fibers facing the outer regions S3, the laser oscillator that is connected to the optical fibers facing the corner adjacent regions S4, the laser oscillator that is connected to the optical fibers facing the corner region S1. Even in the embodiment, the electronic part 3 is as a whole heated as uniformly as possible.

In the bonding tool 14 as similar to the first embodiment, the insulation grooves 41, which suppress the heat transfer therebetween, are disposed at middle sections between those of the corner regions S1, the inner regions S2, the outer regions S3, the corner adjacent regions S4 and the no irradiation region S2'. Thereby, in comparison to a structure without the insulation grooves 41, it is possible to more effectively heat the whole region of the electronic part to a preferred temperature.

Specifically, in the embodiments, by respectively providing the laser oscillation parts 7-1 to 7-36 to the optical fibers f1 to f36 and by providing the insulation grooves to the all middle sections between the sub regions respectively heated by the optical fibers, it is possible to realize a fine heat temperature control for each of the sub regions. It is also useful to handle a refined bump of which a melting state is difficult to control.

Additionally, like the first embodiment, it is practical to arrange laser oscillators that oscillate laser beams having an identical output in series with respect to one power source, and to group them.

Figure 10:
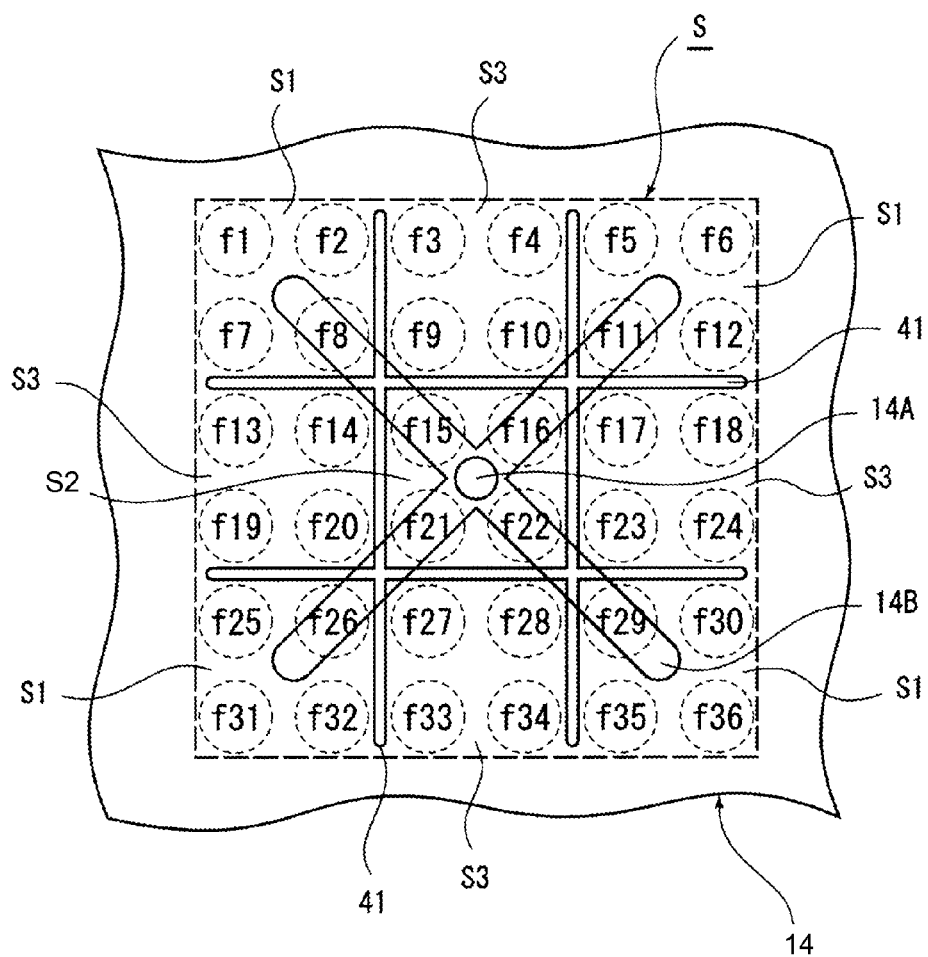
FIG. 10 is a bottom view of a bonding tool 14 of the third embodiment.

FIG. 10 shows the third embodiment in which the heat region S is segmented into three type regions.

In the embodiment, the above heat region S is formed with the above discussed four corner regions S1, four outer regions S3 that are outer regions, which are at outer side of the electronic part 3, from which the corner regions S1 are eliminated, and one inner region S2 that are at a center, each of nine regions having an identical area. Namely, the heat region S of the electronic part is divided into total nine sections that are 3×3 equal sections in up-down and right-left directions. Since no irradiation region S2' is not formed, the whole surface of the heat region S is irradiated by the laser beam.

Particularly, laser beam injection openings of four optical fibers are arranged to optically face each of the corner regions S1. Four optical fibers f1, f2, f7 and f8 are arranged for the corner region S1 that is at the upper left, four optical fibers f5, f6, f11 and f12 are arranged for the corner regions S1 that is at the upper right. Four optical fibers f25, f26, f31 and f32 are arranged for the corner regions S1 that is at the lower left. Four optical fibers f29, f30, f35 and f36 are arranged for the corner regions S1 that is at the lower right.

Oscillation parts, which are connected to those sixteen optical fibers, are set to have the highest level output.

Among twenty optical fibers, laser beam injection openings of four optical fibers f15, f16, f21 and f22 are arranged to face the single inner regions S2. Oscillation parts, which are connected to those four optical fibers, are set to have the lowest level output.

The remaining sixteen optical fibers correspond to the four outer regions S3. Laser beam injection openings of four optical fibers f3, f4, f9 and f10 are for an outer region S3 at an upper center. Laser beam injection openings of four optical fibers f13, f14, f19 and f20 are for an outer region S3 at a center left. Laser beam injection openings of four optical fibers f17, f18, f23 and f24 are for an outer region S3 at a center right. Laser beam injection openings of four optical fibers f27, f28, f33 and f34 are for an outer region S3 at a lower center. Oscillation parts, which are connected to those sixteen optical fibers, are set to have the medium level output.

In the embodiment, the heat region S is divided in nine regions having an identical area. Total four insulation grooves 41 are formed at middle sections between those of regions S1 to S3 and at a lower surface of the bonding tool 14 so that heat transfers between those regions is suppressed.

Other structures are similar to or same as the first embodiment. Thereby, similar functions and advantages are realized through the embodiment as well.

Further, as another embodiment, referring to FIG. 10, it may be practical to set two laser outputs of laser oscillators identical, one laser oscillator connected to an optical fiber of which a laser beam injection opening faces the outer region S3, the other laser oscillator connected to an optical fiber facing the corner region S1. And, the laser outputs may be set higher than a laser output of a laser oscillator connected to an optical fiber of which a laser beam injection opening faces the inner region.

In that structure, a whole region of the outer regions that are outer peripheral side of the electronic part including the corner regions is heated by a laser output that is higher than that is for the inner regions, and there are the insulation grooves between the whole region of the outer regions and the inner regions. Accordingly, the electronic part is as a whole uniformly heated by the structure as well.

Additionally, the insulation grooves 41 are used as an insulation part in the above embodiment. It has not been limited to the structure. For example, it may be practical to cut the bonding tool 14 into multiple pieces, and to combine those pieces intervening insulation materials therebetween so that those cut pieces are mutually connected (turning into one piece).

What is claimed is:

1. A bonding device, comprising:
a plurality of laser oscillators that oscillate laser beams;
a plurality of guide beam parts that guide the laser beams oscillated from the laser oscillators;
a bonding tool that is irradiated and heated by the laser beams guided from the guide beam parts so that an electronic part held on the bonding tool is heated by the laser beams and is bonded to a base plate, wherein
the bonding tool is segmented into a plurality of heat regions,
each of the heat regions is irradiated by the laser beams that are guided through the guide beam parts so that some of the heat regions are heated at a temperature different from other heat regions,
the electronic part is in a polygon shape having a plurality of corners,
the heat regions are segmented into corner regions, outer regions and inner regions, the corner regions that correspond to the corners, the outer regions that are at an outer side and other than the corner regions, and the inner regions that are at an inner side, and
laser outputs of the laser oscillators for the inner regions, the outer regions and the corner regions are set to satisfy that
the laser output for the inner regions is smaller than that for the outer regions, and
the laser output for the outer regions is smaller than that for the corner regions, and
an insulation part is disposed at a middle section between two of the heat regions, the insulation part suppressing a heat transfer between the heat regions.

2. The bonding device of claim 1, wherein
the insulation part is shaped as a groove formed on the bonding tool.

3. The bonding device of claim 2, wherein
the bonding tool has a chip suck path that is a hole through which a negative pressure is imported so that the electronic part is sucked and held by the negative pressure on the bonding tool, and
when the electronic part is sucked on the bonding tool, the groove as the insulation part becomes airtight by the electronic part, and is communicatively connected to the chip suck path.

4. The bonding device of claim 1, wherein
the heat regions are further segmented into corner adjacent regions that surround the corner regions,
laser output of the laser oscillators for the corner adjacent regions is set to be above the laser output for the outer regions and below the laser output for the corner regions.

* * * * *